(12) United States Patent
Eissa et al.

(10) Patent No.: US 6,723,658 B2
(45) Date of Patent: Apr. 20, 2004

(54) GATE STRUCTURE AND METHOD

(75) Inventors: Mona M. Eissa, Plano, TX (US); Antonio L. P. Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/195,639

(22) Filed: Jul. 15, 2002

(65) Prior Publication Data

US 2004/0009675 A1 Jan. 15, 2004

(51) Int. Cl.[7] .............................................. H01L 21/302
(52) U.S. Cl. ....................................................... 438/745
(58) Field of Search ................... 438/745, 756

(56) References Cited

U.S. PATENT DOCUMENTS

| | | | |
|---|---|---|---|
| 6,284,721 B1 * | 9/2001 | Lee ............................. | 510/175 |
| 6,455,330 B1 * | 9/2002 | Yao et al. ....................... | 438/3 |
| 6,514,808 B1 * | 2/2003 | Samavedam et al. ........ | 438/197 |
| 6,551,943 B1 * | 4/2003 | Eissa et al. ................. | 438/718 |
| 6,555,879 B1 * | 4/2003 | Krivokapic et al. ......... | 257/382 |
| 6,624,086 B1 * | 9/2003 | Eissa .......................... | 438/745 |

* cited by examiner

Primary Examiner—Hoai Ho
Assistant Examiner—Quoc Hoang
(74) Attorney, Agent, or Firm—Carlton H. Hoel; W. James Brady; Frederick J. Telecky, Jr.

(57) ABSTRACT

A MOSFET structure with silicate gate dielectrics and silicon or metal gates with HF-based wet silicate gate dielectric etch.

8 Claims, 9 Drawing Sheets

GATE STRUCTURE AND METHOD

CROSS-REFERENCE TO RELATED APPLICATIONS

The following patent applications disclose related subject matter: Ser. No. 10/006,081, filed Dec. 6, 2001. These applications have a common assignee with the present application.

BACKGROUND OF THE INVENTION

The invention relates to electronic semiconductor devices, and, more particularly, to gate structures and fabrication methods for integrated circuits.

The trend in semiconductor integrated circuits to higher device densities by down-scaling structure sizes and operating voltages has led to silicon field effect (MOS) transistor gate dielectrics, typically made of silicon dioxide, to approach thicknesses on the order of 1–2 nm to maintain the capacitive coupling of the gate to the channel. However, such thin oxides present leakage current problems due to carrier tunneling through the oxide. Consequently, alternative gate dielectrics with greater dielectric constants to permit greater physical thicknesses have been proposed. Indeed, $Ta_2O_5$, $(Ba,Sr)TiO_3$, and other high dielectric constant materials have been suggested, but such materials have poor interface stability with silicon.

Wilk and Wallace, Electrical Properties of Hafnium Silicate Gate Dielectrics Deposited Directly on Silicon, 74 Appl. Phys. Lett. 2854 (1999), disclose measurements on capacitors with a hafnium silicate dielectric formed by sputtering deposition (at a pressure of $5 \times 10^{-6}$ mTorr and substrate temperature of 500° C.) of a 5 nm thick $Hf_6Si_{29}O_{65}$ ($Hf_{0.18}Si_{0.89}O_2$) layer directly onto silicon together with a gold top electrode deposition onto the silicate dielectric. Such capacitors showed low leakage current, thermal stability, an effective dielectric constant of about 11, and a breakdown field of 10 MV/cm.

However, such high-k dielectrics have problems with high volume production of silicon integrated circuits such as effective etches.

SUMMARY OF THE INVENTION

The present invention provides integrated circuit fabrication with metal silicate gate dielectrics by use of silicates etches including nitric acid with added peroxide and fluoride.

BRIEF DESCRIPTION OF THE DRAWINGS

The drawings are heuristic for clarity.

DESCRIPTION OF THE PREFERRED EMBODIMENTS

1. Overview

Preferred embodiment fabrication methods include selective removal of a high-k dielectric material such as $Hf_{0.18}Si_{0.89}O_2$ with solutions of nitric and hydrofluoric acids. Preferred embodiment integrated circuits and MOS transistors include high-k gate dielectrics and/or capacitor dielectrics formed using the preferred embodiment methods.

2. Silicon Gate with High-k Gate Dielectric Preferred Embodiments

FIGS. 1a–1j illustrate in cross sectional elevation views the steps of first preferred embodiment fabrication methods for integrated circuits including field effect transistors (e.g., CMOS or BiCMOS) with silicate gate dielectrics and polysilicon gates. The preferred embodiments include the following steps:

(1) Substrate

Figure 1A:
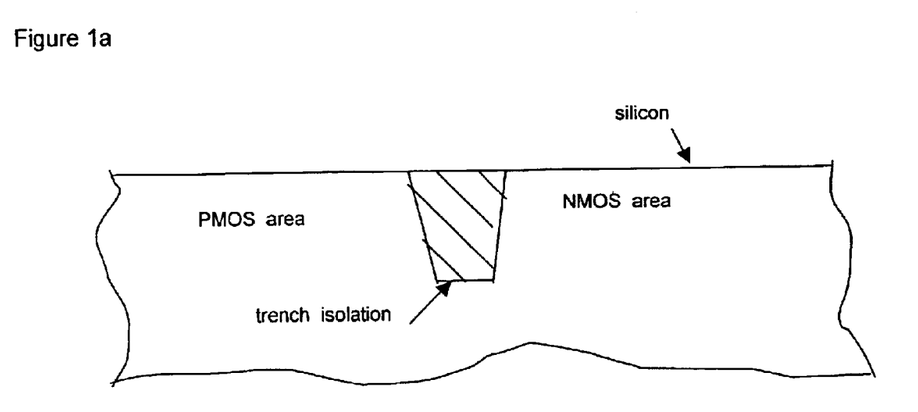
FIGS. 1a–1i are cross sectional elevation views of steps of a preferred embodiment integrated circuit fabrication method.
Figure 1B:
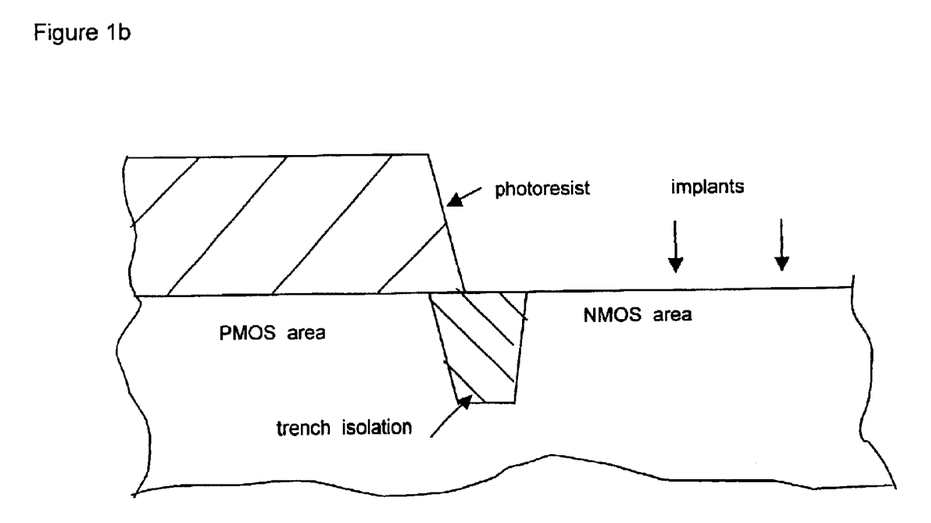

Start with a p-type silicon (or silicon-on-insulator) wafer 102 with <100> orientation and form shallow trench isolation by pad oxide growth, nitride deposition, trench pattern, nitride-oxide-silicon trench etch, trench surface oxidation, trench fill by blanket APCVD oxide deposition, etch-CMP planarization, and nitride strip. FIG. 1a is a cross-sectional elevation view of the substrate illustrating the trench isolation and locations for fabrication of NMOS and PMOS transistors. Next, perform multiple dopant implants to form n- and p-type wells (plus, optionally, memory cell array wells and bipolar device buried layers) plus form channel stop regions, punchthrough deterrence regions, and threshold adjust regions. These implants are performed through the residual pad oxide. FIG. 1b illustrating the masked NMOS transistor location implants; a similar masked implant occurs in the PMOS locations. Note that the implant doses and depths may differ for memory cell array transistors as compared to peripheral transistors. Also, both high and low voltage transistors of the same type may be formed and may have different implant doses and depths. A rapid thermal anneal (e.g., 1050° C. for 30 s) activates and diffuses the implanted dopants (e.g., boron and phosphorus).

(2) High-k Gate Dielectric Deposition

Figure 1C:
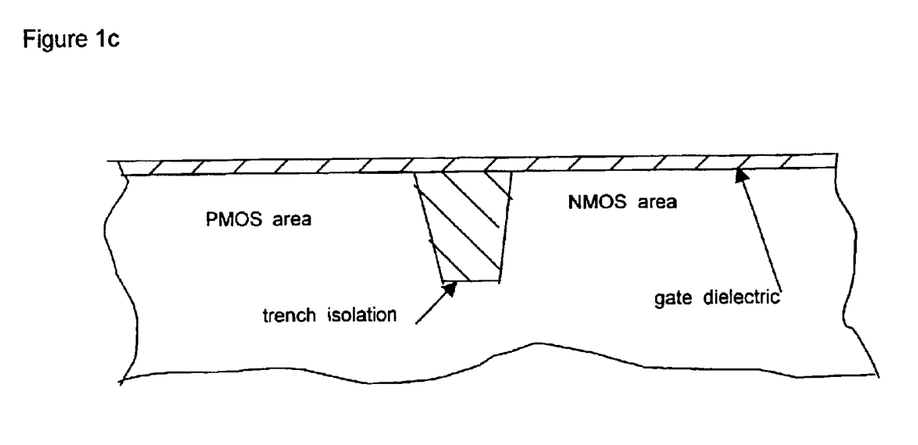

Deposit high-k gate dielectric, e.g., $Hf_{0.55}Si_{0.45}O_2$, by CVD, ALD or PVD to a thickness of about 7 nm; see FIG. 1c. Other (non-stoichiometric) variations of the hafnium silicate could be used; that is, $Hf_wSi_xO_y$. This deposition of silicate results in an effective dielectric constant of about 14, so the 7 nm thick silicate has an equivalent silicon dioxide thickness of 2 nm but not the leakage (tunneling) current of such a thin silicon dioxide gate dielectric. Also, after deposition the hafnium silicate dielectric layer could be nitrided and compensate for oxygen vacancies. That is, the resultant dielectric material may generally be $Hf_wSi_xO_yN_z$ with the composition roughly stoichiometric but not easily crystallizable.

(2') Split Gate Option

Various integrated circuits include both high voltage and low voltage transistors; that is, MOS transistors with differing operating voltages such as differing maximum source-drain voltages and gate-source voltages. For example, high voltage transistor could be used for peripheral transistors or programmable transistors, and low voltage transistors used for central processor or memory array transistors to limit power consumption and heat generation. High voltage MOS transistors require a thicker gate dielectric than low voltage MOS transistors in order to avoid breakdown. A modification of the foregoing step (2) can provide for two or more transistor gate dielectric thicknesses through various approaches. For example, first grow a thin silicon dioxide layer; next, strip this oxide layer in areas for low voltage transistors; then perform the passivation and silicate deposition of step (2) with silicate dielectric thickness targeted for the low voltage transistors. The unremoved initial grown oxide under the silicate dielectric in the areas for high voltage transistors provides the required extra dielectric thickness.

(3) Gate Material Deposition

Figure 1D:
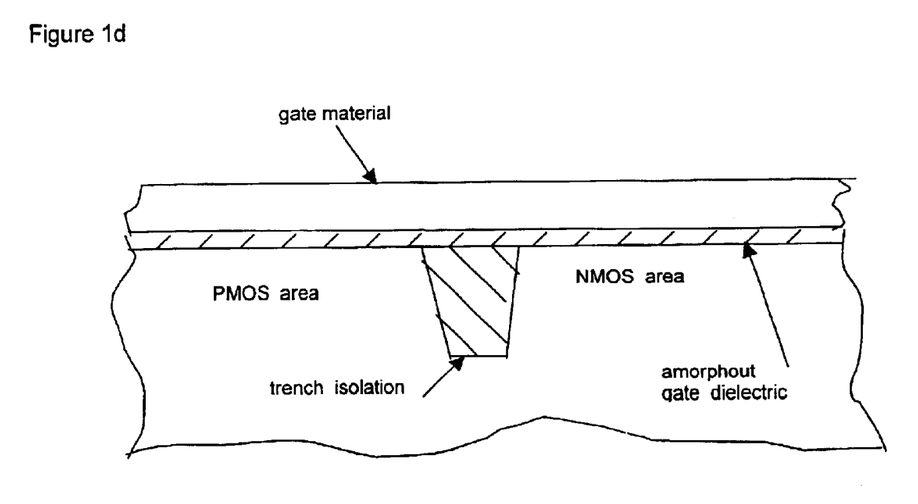
Figure 1E:
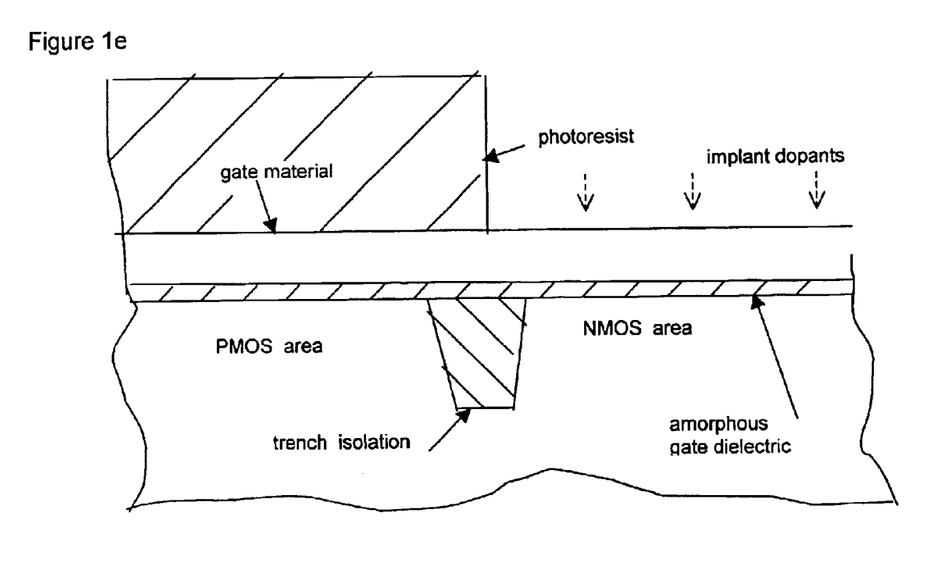

Deposit a layer of amorphous silicon (or polysilicon) gate material of thickness 100 nm on the treated silicate gate dielectric; see FIG. 1d. The deposition may be low temperature decomposition of silane; the low temperature (low thermal budget) helps avoid crystallization of the high-k dielectric material. Then dope the gate material n and p type in the NMOS and PMOS areas, respectively, by non-critical photoresist masking and dopant implantations; see FIG. 1e. (Polysilicon emitters for npn bipolars would be in the n type area.) Alternative gate materials such as metals could be deposited instead of the amorphous silicon.

(4) Gate Mask and Etch

Spin on a layer of photoresist which is sensitive to deep ultraviolet; optionally, an antireflective coating (ARC) layer could be deposited prior to the photoresist in order to limit interference effects during photoresist exposure. The composition of the ARC and thickness are selected according to the exposure wavelength and the reflectivity of the underlying gate material. Expose the photoresist through a reticle for gates and gate level interconnects; the exposed minimal linewidth may be about 50 nm. Lastly, develop photoresist and strip exposed ARC, if any.

Figure 1F:
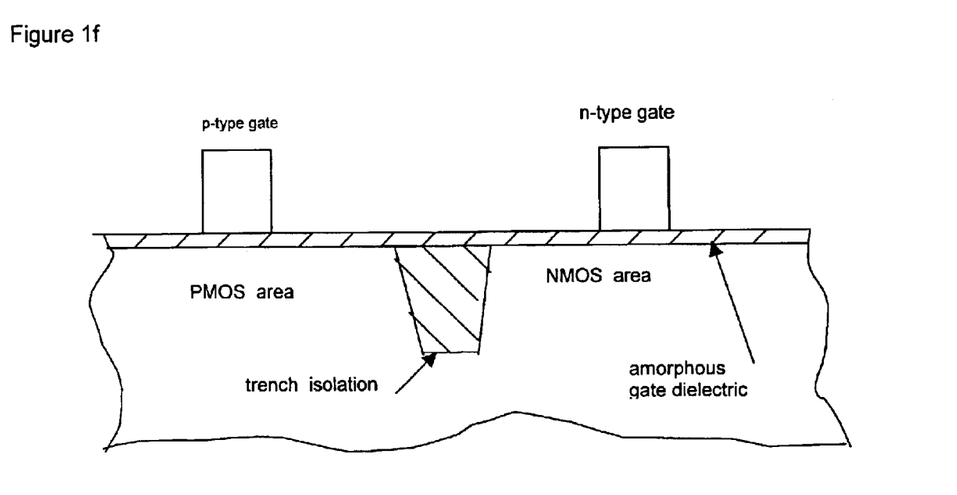
Figure 1G:
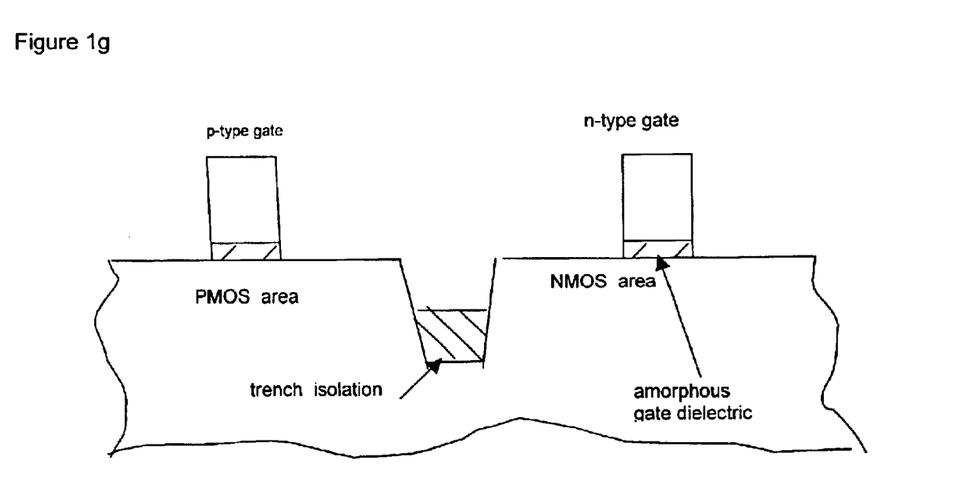

Use the patterned photoresist as an etch mask for the anisotropic plasma etch of the gate material to form gates and gate level interconnects. For silicon gates the etch may be two steps with the second step a HBr plus oxygen source plasma which is very selective to high-k silicate gate dielectric material. If the gate etch erodes the photoresist, the underlying ARC layer provides sufficient etch masking. The gate material could also provide a polysilicon emitter for bipolar devices. Gates may be 100 nm high and 50 nm long (FIG. 1f is a cross section along the gate length, and gates typically have widths much greater than their lengths).

(5) High-k Gate Dielectric Etch

Prior to lightly-doped drain (LDD) implants or source/drain implants, remove the portion of the high-k gate dielectric material remaining on the source/drain areas to avoid knock-on implantation of metal atoms (i.e., Hf) during the LDD and/or source/drain implants. This contrasts with the case of silicon dioxide gate dielectric in which the LDD implant can be made through the dielectric. But the etching of the high-k dielectric material should have as high a selectivity with respect to the gate polysilicon and the isolation (shallow trench) oxide as possible. Thus strip the exposed high-k dielectric material by immersion in a solution with volume ratios 1:1:20:100 of HF (49%), $H_2O_2$ (30%), $HNO_3$ (70%), and $H_2O$ at 50° C. for a time depending upon thickness; see FIG. 1g. A short overetch generates minimal undercutting of the high-k gate dielectric material laterally under the gates.

The following table illustrates etch rates (nm/minute) at 50° C. for various mixtures

| solution | Hf silicate | TEOS | ratio |
|---|---|---|---|
| $HF:H_2O$ (1:100) | 0.65 | 16.3 | 0.040 |
| $HF:HNO_3:H_2O$ (1:20:100) | 0.45 | 8.7 | 0.052 |
| $HF:H_2O_2:HNO_3:H_2O$ (1:1:20:100) | 1.16 | 21.6 | 0.054 |

The preferred embodiment method etches the 7 nm thick Hf silicate gate dielectric with a 50% overetch; the 7 nm silicate dielectric should be stripped in about 6 minutes and thus the overetch should be about 3 minutes. The overetch removes roughly 65 nm of TEOS CVD oxide in the isolation trenches after the 7 nm of silicate dielectric has been stripped; see FIG. 1g. The temperature of the etching solution could be varied in the range of 10–60° C. with corresponding variation of the etch rates. And the etch rate of the silicate is greater for amorphous silicate than for crystalline, so the amorphization of the exposed silicate by low energy ion-implantation or plasma immersion brings additional benefits.

This etch also slowly etches the silicon gates but at only about ⅙ the rate that it etches the silicate dielectric. Also, the etch removes silicon nitride at roughly ⅒ the rate that it etches the deposited TEOS oxide; thus filling the isolation trenches with silicon nitride would limit the trench isolation removal. In any event, subsequent dielectric deposition (see step (7) below) will refill the trenches, so the removal of some of the trench fill can be tolerated.

Figure 4:
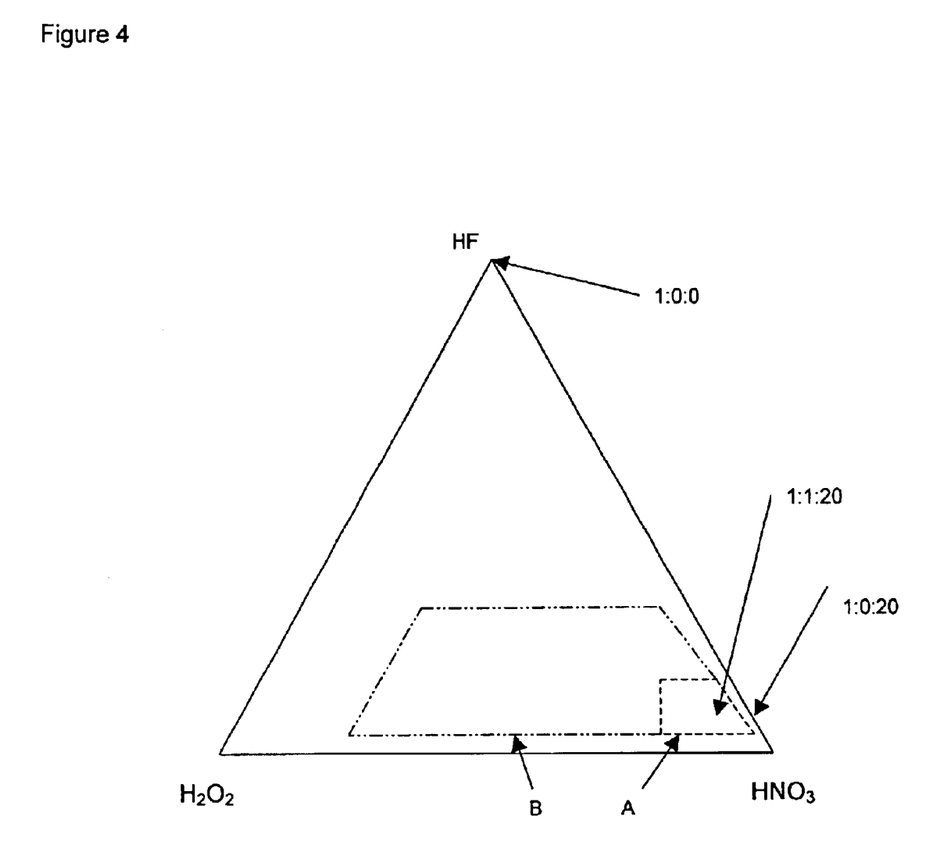
FIG. 4 is a composition diagram.

FIG. 4 is a relative composition diagram of etch solutions: the diagram shows the relative concentrations of HF, $H_2O_2$, and $HNO_3$. The amount of water just sets the overall total concentration; and for low concentration solutions generally, increased total concentration implies increased etch rates. The region labeled "A" in FIG. 4 corresponds to preferred embodiment etch solutions analogous to the foregoing 1:1:20:100. Alternative preferred embodiment etch solutions with relatively less nitric acid are shown in the region labeled "B" in FIG. 4. The extreme concentration boundaries are respectively: 0.05% to 5% for HF; 0.05% to 40% for $HNO_3$ and 0.05% to 30% for $H_2O_2$.

(6) Sidewall Spacers

Figure 1H:
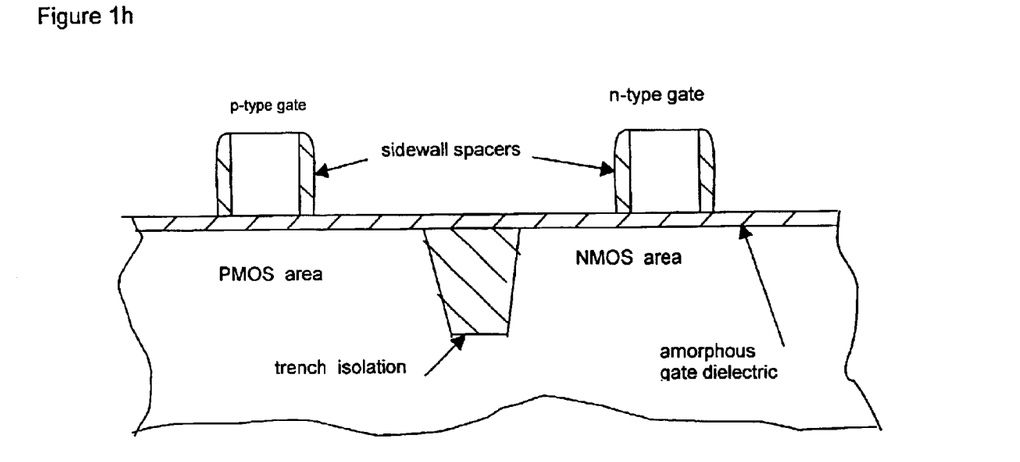

Form sidewall spacers on the gate sidewalls (and gate level interconnects) by a blanket conformal deposition of spacer material (such as 20 nm of silicon nitride or silicon dioxide) followed by anisotropic etch back to remove the spacer material from horizontal surfaces. FIG. 1h illustrates the resulting sidewall spacers when formed prior to the high-k gate dielectric etch of step (5); this provides some extra high-k gate dielectric to limit undercutting effects of the wet etch of step (5). Alternatively, the sidewall spacers may be formed after the high-k dielectric etch.

Implant dopants to form source/drain regions using the gates plus sidewall spacers as self-aligning masks; this also adds further dopants to the gates. As before, use a non-critical mask on the NMOS regions during PMOS source/drains implant and a non-critical mask on the PMOS regions during NMOS source/drains implant. For lightly-doped drains, use first implants after gate formation and high-k gate dielectric material etch of step (5) but prior to sidewall spacer formation.

(7) Interlevel Dielectric and Contacts

Figure 1I:
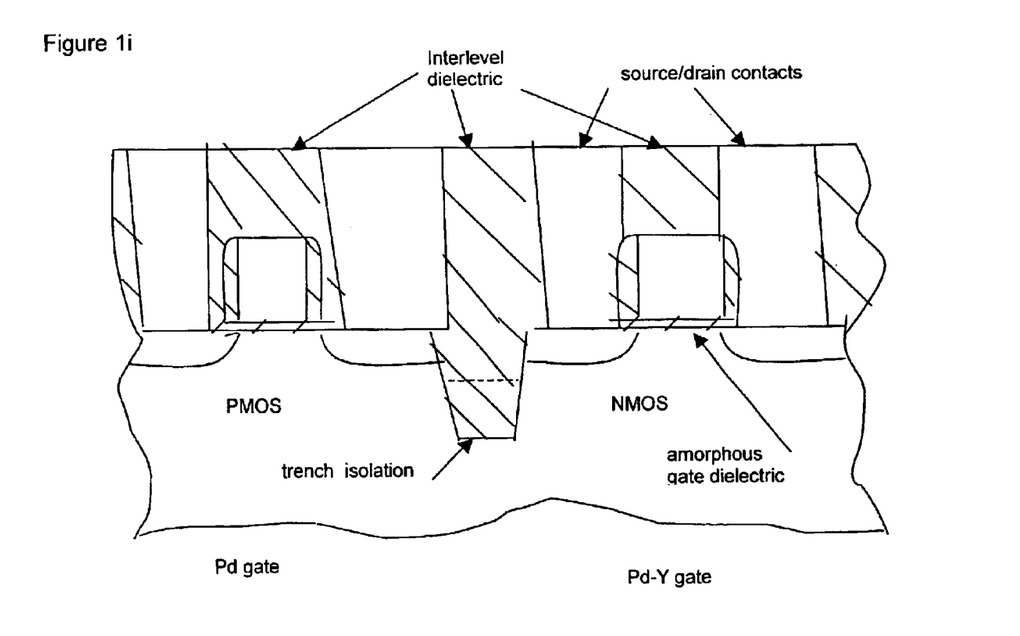

FIG. 1i illustrates subsequent structure after deposition of a first interlevel dielectric (premetal dielectric) and formation of contacts to source/drains. The integrated circuit fabrication continues with further levels of dielectrics and interconnects. Note that the interlevel dielectric refills the portion of the trench isolation dielectric removed in the high-k gate dielectric etch.

3. Metal and Suicide Gate Materials

Figure 2:
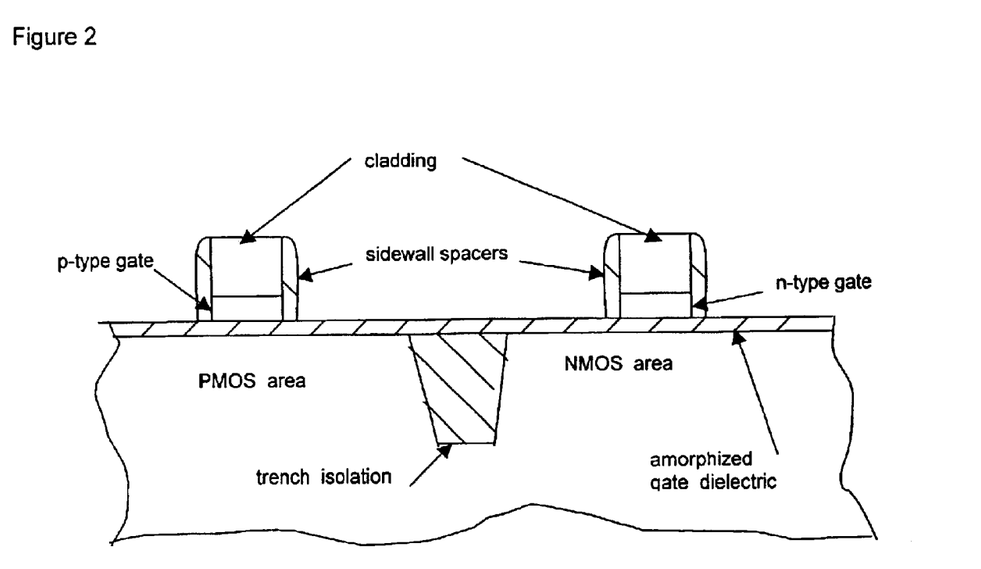
FIG. 2 illustrates a variant preferred embodiment.

The gate material deposited in step (3) could be metal or metal silicide, and could-be two different materials with work functions appropriate for NMOS and PMOS devices, such as Ti and Mo or $TaSi_2$ and $Pd_2Si$. Further, the gates (including silicon gates) could be clad with a metal or metal silicide to increase conductivity; see FIG. 2.

4. Disposable Gate Preferred Embodiments

Figure 3A:
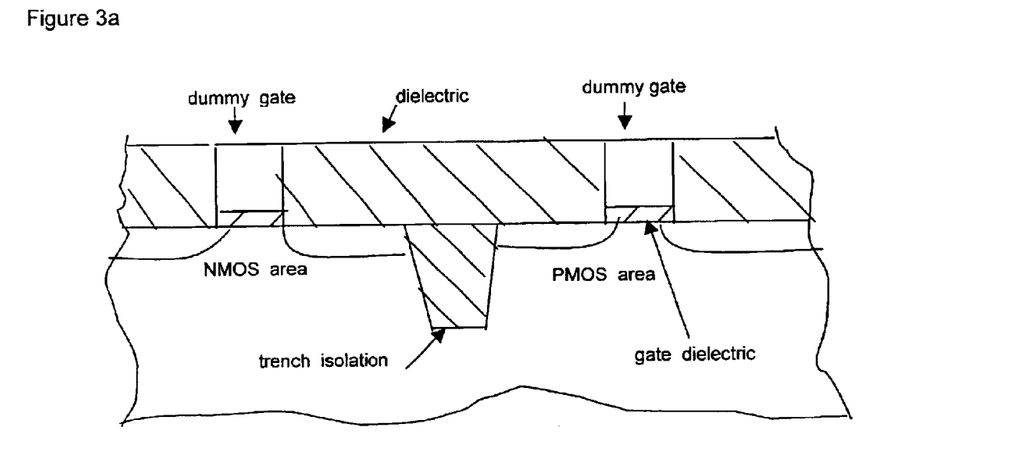
FIGS. 3a–3c show in cross-sectional elevation views another preferred embodiment method.
Figure 3B:
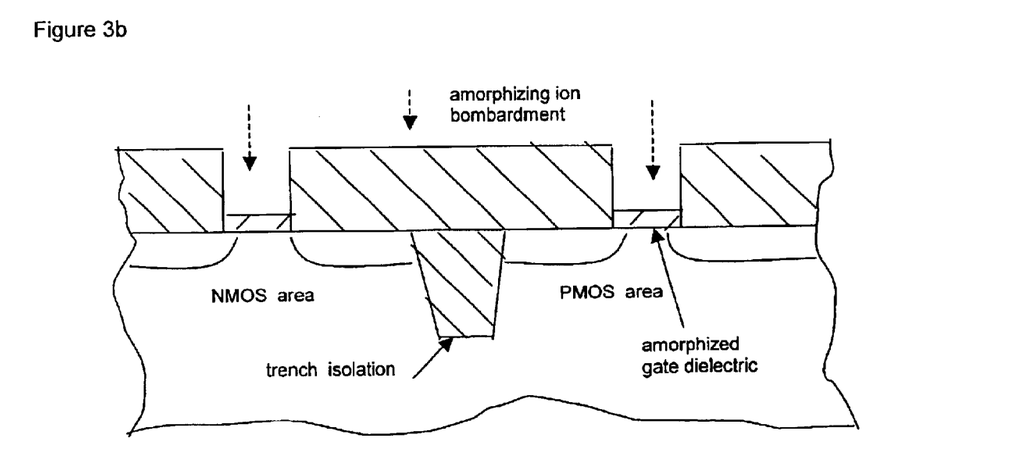
Figure 3C:
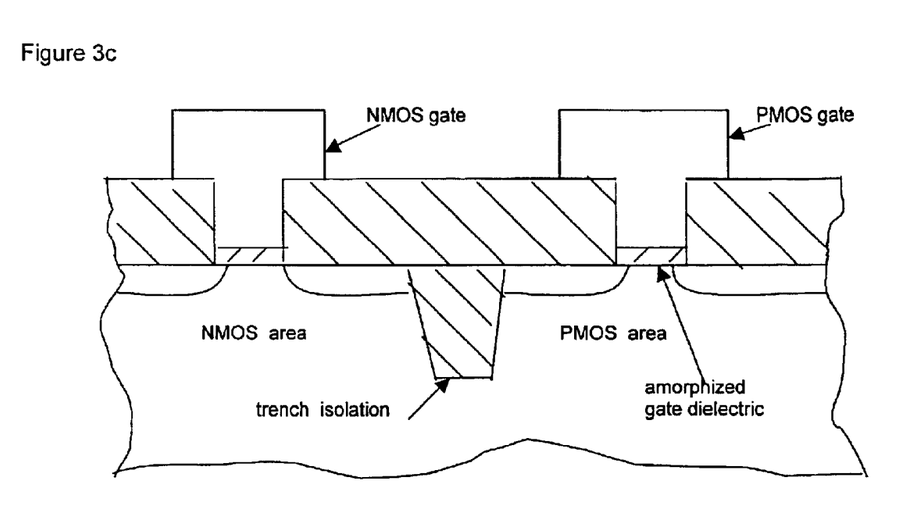

FIGS. 3a–3c illustrate a preferred embodiment disposable gate method of integrated circuit fabrication which uses a preferred embodiment high-k gate dielectric wet etch. In particular, follow the steps (1)–(5) of the foregoing preferred embodiment to have a polysilicon dummy gate with stripped exposed high-k gate dielectric and implanted source/drains formed in the substrate. Alternatives include adding sidewall spacers to increase the high-k gate dielectric protected from the wet etch.

Deposit 200-nm-thick dielectric, such as TEOS oxide, and planarize the resulting structure, such as by CMP, to expose the top of the polysilicon dummy gate. FIG. 3a shows dummy gate and gate dielectric; a dummy gate may be about 200 nm high and 50 nm long.

Etch out the dummy gates with an $HBr+O_2$ plasma which stops on the high-k gate dielectric layer. Optionally, strip the gate dielectric and deposit a new 7 nm thick high-k gate dielectric layer at the bottom of the grooves left by the removal of dummy gates; this also deposits roughly 7 nm of high-k dielectric material on the sidewalls to shorten the eventual gate to 35–40 nm. Of course, if the original gate dielectric layer is removed at the bottoms of the grooves, then the original gate dielectric layer could be any convenient dielectric material, such as silicon dioxide or silicon nitride. Optionally, then perform an amorphizing ion bombardment of the high-k gate dielectric layer as illustrated in FIG. 3b; this may be omitted if the treatment had previously been performed on the high-k gate dielectric layer prior to dummy gate material deposition.

Next, blanket deposit a gate material, such as one of the foregoing different metals, alloys, silicides, etc. to fill the grooves plus cover the planarized dielectric; the gate material may be 100 nm thick. Note for the case of suicide gates, the dummy silicon gates need only be partially removed and metal may be deposited directly on the remaining dummy gate and then reacted with the dummy gate to form the silicide. To form different suicide gates for NMOS and PMOS deposit a first metal, next, pattern and etch to remove the first metal from NMOS (PMOS) areas and then deposit a second metal and silicide.

Spin on and pattern photoresist to define a gate top of length 250 nm, and use the patterned photoresist to etch gate material to form T-shaped gate; see FIG. 3c.

Continue as in the foregoing to form interlevel dielectrics and interconnects.

5. Modifications

The preferred embodiments can be modified in various ways while retaining the features of device fabrication using a wet HF-based etch of high-k silicate gate dielectric material.

For example, the high-k silicate gate dielectric material could include $Zr_xSi_{2-x}O_4$ and related compounds with varying nonstoichiometry (e.g., oxygen vacancies) and/or with nitrides $Zr_xSi_{2-x}O_yN_z$ and mixtures with comparable Hf compounds.

What is claimed is:

1. A fabrication method, comprising:
   (a) providing a silicate gate dielectric layer with gates thereon;
   (b) etching exposed portions of said layer with a solution containing HF, $H_2O_2$ and $HNO_3$.
2. The method of claim 1, wherein:
   (a) said solution corresponds to a point within region (A) of FIG. 4.
3. The method of claim 1, wherein:
   (b) said solution corresponds to a point within region (B) of FIG. 4.
4. The method of claim 1, wherein:
   (a) said solution has a temperature in the range of 10–60° C.
5. The method of claim 1, wherein:
   (a) said silicate gate dielectric includes Hf, Si, O, and N.
6. The method of claim 1, wherein:
   (a) said silicate gate dielectric includes Hf, Si, and O.
7. The method of claim 1, wherein:
   (a) said silicate gate dielectric includes: Zr, Si, O, and N.
8. The method of claim 1, wherein:
   (a) said silicate gate dielectric includes: Zr, Si, and O.

* * * * *